United States Patent
Hosokawa et al.

(10) Patent No.: US 10,615,220 B2
(45) Date of Patent: Apr. 7, 2020

(54) SEMICONDUCTOR DEVICE AND MANUFACTURING METHOD THEREOF

(71) Applicant: HAMAMATSU PHOTONICS K.K., Hamamatsu-shi, Shizuoka (JP)

(72) Inventors: Noburo Hosokawa, Hamamatsu (JP); Nao Inoue, Hamamatsu (JP); Katsumi Shibayama, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/562,004

(22) PCT Filed: Mar. 31, 2016

(86) PCT No.: PCT/JP2016/060834
§ 371 (c)(1),
(2) Date: Sep. 27, 2017

(87) PCT Pub. No.: WO2016/159320
PCT Pub. Date: Oct. 6, 2016

(65) Prior Publication Data
US 2018/0108625 A1  Apr. 19, 2018

(30) Foreign Application Priority Data
Mar. 31, 2015 (JP) .................. 2015-070697

(51) Int. Cl.
  *H01L 27/146* (2006.01)
  *H01L 23/00* (2006.01)
  (Continued)

(52) U.S. Cl.
  CPC .... *H01L 27/14687* (2013.01); *H01L 21/3205* (2013.01); *H01L 21/768* (2013.01);
  (Continued)

(58) Field of Classification Search
  CPC .......... H01L 27/14687; H01L 21/3205; H01L 21/768
  See application file for complete search history.

(56) References Cited

U.S. PATENT DOCUMENTS 9,601,426 B1  3/2017  Bonilla et al.
9,659,980 B2  5/2017  McGarvey et al.
(Continued)

FOREIGN PATENT DOCUMENTS

CN  101055867 A  10/2007
CN  102655136 A  9/2012
(Continued)

OTHER PUBLICATIONS

International Preliminary Report on Patentability dated Oct. 12, 2017 for PCT/JP2016/060832.
(Continued)

*Primary Examiner* — Wael M Fahmy
*Assistant Examiner* — Sarah K Salerno
(74) *Attorney, Agent, or Firm* — Drinker Biddle & Reath LLP

(57) ABSTRACT

A semiconductor device includes a semiconductor substrate in which a through hole is formed, a first wiring that is provided on a first surface of the semiconductor substrate, an insulating layer provided on an inner surface of the through hole and a second surface of the semiconductor substrate, and a second wiring that is provided on a surface of the insulating layer and electrically connected to the first wiring in an opening. The surface of the insulating layer includes a first region, a second region, a third region, a fourth region that is curved to continuously connect the first and the second regions, and a fifth region that is curved to continuously connect the second and the third regions. An average (Continued)

inclination angle of the second region is smaller than that of the first region and is smaller than that of the inner surface.

12 Claims, 9 Drawing Sheets

(51) Int. Cl.

| | | |
|---|---|---|
| H01L 31/0224 | (2006.01) | |
| H01L 21/3205 | (2006.01) | |
| H01L 23/522 | (2006.01) | |
| H01L 23/532 | (2006.01) | |
| H01L 21/768 | (2006.01) | |
| H01L 31/107 | (2006.01) | |
| H01L 31/02 | (2006.01) | |
| H01L 31/0216 | (2014.01) | |
| H01L 31/103 | (2006.01) | |
| H01L 23/48 | (2006.01) | |
| H01L 31/0203 | (2014.01) | |

(52) U.S. Cl.
CPC ...... *H01L 21/76898* (2013.01); *H01L 23/481* (2013.01); *H01L 23/522* (2013.01); *H01L 23/532* (2013.01); *H01L 24/02* (2013.01); *H01L 24/05* (2013.01); *H01L 27/14632* (2013.01); *H01L 27/14636* (2013.01); *H01L 27/14643* (2013.01); *H01L 31/02005* (2013.01); *H01L 31/02161* (2013.01); *H01L 31/022408* (2013.01); *H01L 31/103* (2013.01); *H01L 31/107* (2013.01); *H01L 24/13* (2013.01); *H01L 31/0203* (2013.01); *H01L 2224/0233* (2013.01); *H01L 2224/0235* (2013.01); *H01L 2224/0236* (2013.01); *H01L 2224/02313* (2013.01); *H01L 2224/02371* (2013.01); *H01L 2224/02372* (2013.01); *H01L 2224/02381* (2013.01); *H01L 2224/0345* (2013.01); *H01L 2224/0557* (2013.01); *H01L 2224/05558* (2013.01); *H01L 2224/05567* (2013.01); *H01L 2224/10126* (2013.01); *H01L 2224/11* (2013.01); *H01L 2224/12105* (2013.01); *H01L 2224/13007* (2013.01); *H01L 2224/13009* (2013.01); *H01L 2224/13021* (2013.01); *H01L 2224/13022* (2013.01); *H01L 2224/13024* (2013.01); *H01L 2224/13025* (2013.01); *H01L 2924/10253* (2013.01); *H01L 2924/12043* (2013.01); *H01L 2924/351* (2013.01)

(56) References Cited

U.S. PATENT DOCUMENTS

| | | |
|---|---|---|
| 9,691,932 B2 | 6/2017 | Sasaki et al. |
| 2004/0041243 A1 | 3/2004 | Ogawa |
| 2008/0265442 A1 | 10/2008 | Yagi |
| 2009/0008566 A1 | 1/2009 | Agarwal et al. |
| 2012/0068327 A1 | 3/2012 | Oganesian et al. |
| 2012/0068330 A1 | 3/2012 | Oganesian et al. |
| 2012/0205816 A1 | 8/2012 | Son et al. |
| 2014/0131882 A1 | 5/2014 | Law et al. |
| 2015/0096798 A1 | 4/2015 | Uzoh |
| 2017/0236852 A1 | 8/2017 | McGarvey et al. |

FOREIGN PATENT DOCUMENTS

| | | |
|---|---|---|
| CN | 103890971 A | 6/2014 |
| CN | 103907206 A | 7/2014 |
| EP | 1519410 | 3/2005 |
| EP | 2802005 | 11/2014 |
| JP | S59-126643 A | 7/1984 |
| JP | H2-268416 | 11/1990 |
| JP | H4-014830 | 1/1992 |
| JP | H7-321205 | 12/1995 |
| JP | H08-330295 A | 12/1996 |
| JP | 2003-101222 A | 4/2003 |
| JP | 2004-057507 A | 2/2004 |
| JP | 2005-019521 | 1/2005 |
| JP | 2005-101268 | 4/2005 |
| JP | 2006-215062 A | 8/2006 |
| JP | 2007-105859 A | 4/2007 |
| JP | 2007-305955 A | 11/2007 |
| JP | 2008-277371 A | 11/2008 |
| JP | 2013-89918 A | 5/2013 |
| JP | 2013-0089919 A | 5/2013 |
| TW | 200509260 A | 3/2005 |
| TW | 200805614 A | 1/2008 |
| TW | 200814256 A | 3/2008 |
| TW | 200915970 A | 4/2009 |
| TW | 201025505 A | 7/2010 |
| TW | 201117337 A | 5/2011 |
| TW | 201242003 A | 10/2012 |
| TW | 201318153 A | 5/2013 |
| TW | 201340272 A | 10/2013 |
| TW | 201347122 A | 11/2013 |
| TW | 201611186 A | 3/2016 |

OTHER PUBLICATIONS

International Preliminary Report on Patentability dated Oct. 12, 2017 for PCT/JP2016/060837.

International Preliminary Report on Patentability dated Oct. 12, 2017 for PCT/JP2016/060838.

International Preliminary Report on Patentability dated Oct. 12, 2017 for PCT/JP2016/060834.

SEMICONDUCTOR DEVICE AND MANUFACTURING METHOD THEREOF

TECHNICAL FIELD

The present invention relates to a semiconductor device and a manufacturing method thereof.

BACKGROUND ART

In semiconductor devices such as an optical device and an electronic device, a front surface side and a rear surface side of the semiconductor substrate are electrically connected to each other via a through hole formed in the semiconductor substrate (for example, refer to Patent Literature 1).

CITATION LIST

Patent Literature

Patent Literature 1: Japanese Unexamined Patent Publication No. 2004-57507

SUMMARY OF INVENTION

Technical Problem

In the semiconductor device described above, there is a risk of an electrical connection via a through hole in the semiconductor substrate being weakened according to reduction in size thereof, high integration, and the like.

Here, an object of the present invention is to provide a semiconductor device capable of forming a reliable electrical connection via a through hole in a semiconductor substrate and a method of manufacturing such a semiconductor device.

Solution to Problem

According to one aspect of the present invention, there is provided a semiconductor device including a semiconductor substrate that has a first surface and a second surface opposite to each other and in which a through hole to extend from the first surface to the second surface is formed; a first wiring that is provided on the first surface and has a portion located above a first opening of the through hole on the first surface side; an insulating layer that is provided on an inner surface of the through hole and the second surface and is continuous through a second opening of the through hole on the second surface side; and a second wiring that is provided on a surface of the insulating layer and is electrically connected to the first wiring in an opening of the insulating layer on the first surface side. The surface of the insulating layer includes a tapered first region that reaches the first opening inside the through hole and enlarges from the first surface to the second surface, a tapered second region that reaches the second opening inside the through hole and enlarges from the first surface to the second surface, a third region that faces the second surface outside the through hole, a fourth region that is curved to continuously connect the first region and the second region, and a fifth region that is curved to continuously connect the second region and the third region. An average inclination angle of the second region is smaller than an average inclination angle of the first region and is smaller than an average inclination angle of the inner surface of the through hole.

In the semiconductor device, within the surface of the insulating layer, the first region that reaches the first opening of the through hole and the second region that reaches the second opening of the through hole are tapered regions that enlarge from the first surface to the second surface of the semiconductor substrate. Thus, the average inclination angle of the second region is smaller than the average inclination angle of the inner surface of the through hole. Accordingly, within the surface of the insulating layer, an angle between the third region that faces the second surface of the semiconductor substrate and the second region that reaches the second opening of the through hole is greater (that is, gentler) than an angle between the second surface of the semiconductor substrate and the inner surface of the through hole. Therefore, during manufacture and after manufacture, a disconnection of the second wiring in a portion of the second opening of the through hole is prevented. In addition, for example, compared to when the insulating layer is formed with a uniform thickness along the inner surface of the through hole, since the inclination of the second region becomes gentler, it is possible to form the second wiring easily and reliably. Further, since it is possible to form the second wiring without depending on the shape of the inner surface of the through hole, for example, even if a pointed portion remains on the inner surface of the through hole, it is possible to prevent a disconnection of the second wiring caused by such a portion. In addition, the average inclination angle of the second region is smaller than the average inclination angle of the first region. In other words, the average inclination angle of the first region that reaches the first opening of the through hole is larger than the average inclination angle of the second region. Accordingly, for example, even if the diameter of the through hole is reduced, a sufficient area of the opening of the insulating layer on the first surface side of the semiconductor substrate is ensured. Therefore, during manufacture and after manufacture, a disconnection between the first wiring and the second wiring in a portion of the opening of the insulating layer is prevented. Further, on the surface of the insulating layer, the fourth region is curved to continuously connect the first region and the second region, and the fifth region is curved to continuously connect the second region and the third region. Therefore, during manufacture and after manufacture, a disconnection of the second wiring is prevented in the entire region of the surface of the insulating layer. In particular, after manufacture, since the stress concentration in the entire region of the surface of the insulating layer is reduced, it is effective to prevent a disconnection of the second wiring. As described above, according to the semiconductor device, a reliable electrical connection via the through hole in the semiconductor substrate can be formed. Here, regarding the average inclination angle of the inner surface of the through hole, a case in which the inner surface (when the inner surface of the through hole is a curved surface such as a cylindrical surface, the tangential plane of the curved surface) of the through hole is orthogonal to the first surface of the semiconductor substrate and the inner surface of the through hole has an angle of 90° with respect to the first surface is included.

In the semiconductor device according to one aspect of the present invention, the average inclination angle of the first region is closer to the average inclination angle of the inner surface of the through hole than the average inclination angle of the second region. Accordingly, it is possible to obtain an opening having a sufficient area for exposing a portion of the first wiring that is positioned on the first opening of the through hole on the first surface side. As a result, during manufacture and after manufacture, it is possible to prevent a disconnection between the first wiring and the second wiring in a portion of the opening of the insulating layer more reliably.

In the semiconductor device according to one aspect of the present invention, an average thickness of the insulating layer provided on the inner surface of the through hole may be greater than an average thickness of the insulating layer provided on the second surface. Accordingly, for example, even if the semiconductor substrate is thinned, since the insulating layer provided on the inner surface of the through hole functions as a reinforcing layer, it is possible to ensure sufficient strength of a peripheral portion of the through hole.

In the semiconductor device according to one aspect of the present invention, the first region may be a surface of a portion having a height of ⅔ of a sum of the thickness of the semiconductor substrate and the average thickness of the insulating layer provided on the second surface or less within the insulating layer provided on the inner surface of the through hole. Accordingly, the first region and the second region are smoothly connected on the surface of the insulating layer, and it is possible to prevent a disconnection of the second wiring at a boundary between the first region and the second region reliably.

In the semiconductor device according to one aspect of the present invention, the first region may be a surface of a portion having a height of ½ of a sum of the thickness of the semiconductor substrate and the average thickness of the insulating layer provided on the second surface or less within the insulating layer provided on the inner surface of the through hole. Accordingly, the first region and the second region are connected more smoothly on the surface of the insulating layer, and it is possible to prevent a disconnection of the second wiring at a boundary of the first region and the second region more reliably.

In the semiconductor device according to one aspect of the present invention, the fourth region may be a region having a maximum convex curvature toward the side opposite the inner surface of the through hole. Such a shape of the insulating layer is particularly effective for forming a reliable electrical connection via the through hole in the semiconductor substrate.

In the semiconductor device according to one aspect of the present invention, the inner surface of the through hole may be a tapered surface that enlarges from the first surface to the second surface. Alternatively, the inner surface (when the inner surface of the through hole is a curved surface such as a cylindrical surface, the tangential plane of the curved surface) of the through hole may be a surface orthogonal to the first surface and the second surface. In either case, it is possible to form a reliable electrical connection via the through hole in the semiconductor substrate.

In the semiconductor device according to one aspect of the present invention, the insulating layer may be made of a resin. Accordingly, it is possible to form an insulating layer having the shape described above easily and reliably.

According to one aspect of the present invention, there is provided a method of manufacturing a semiconductor device. The method of manufacturing a semiconductor device includes a first process in which a first wiring is provided on a first surface of a semiconductor substrate that has the first surface and a second surface opposite to each other; a second process in which a through hole to extend from the first surface to the second surface is formed in the semiconductor substrate, and a portion of the first wiring is exposed to a first opening of the through hole on the first surface side; a third process in which an insulating layer that is continuous through a second opening of the through hole on the second surface side is provided on an inner surface of the through hole and the second surface; a fourth process in which a contact hole is formed in the insulating layer and a portion of the first wiring is exposed to an opening of the insulating layer on the first surface side; and a fifth process in which a second wiring is provided on a surface of the insulating layer and the first wiring and the second wiring are electrically connected in the opening of the insulating layer on the first surface side.

According to the method of manufacturing a semiconductor device, it is possible to efficiently manufacture a semiconductor device in which a reliable electrical connection via a through hole in the semiconductor substrate is formed.

In the method of manufacturing a semiconductor device according to one aspect of the present invention, in the third process, a dip coating method is performed using a resin material having a viscosity of 10 cp or more, and thus the insulating layer may be provided on the inner surface of the through hole and the second surface. Accordingly, it is possible to obtain the insulating layer having the shape described above easily and reliably In the method of manufacturing a semiconductor device according to one aspect of the present invention, in the third process, the insulating layer may be provided on the inner surface of the through hole and the second surface by using a positive resin material. In the fourth process, portion corresponding to the contact hole in the insulating layer is exposed and developed, and thus the contact hole may be formed in the insulating layer. Accordingly, it is possible to obtain the insulating layer having the shape described above easily and reliably.

Advantageous Effects of Invention

According to the present invention, it is possible to provide a semiconductor device capable of forming a reliable an electrical connection via a through hole in a semiconductor substrate and a method of manufacturing such a semiconductor device.

Figure 1:
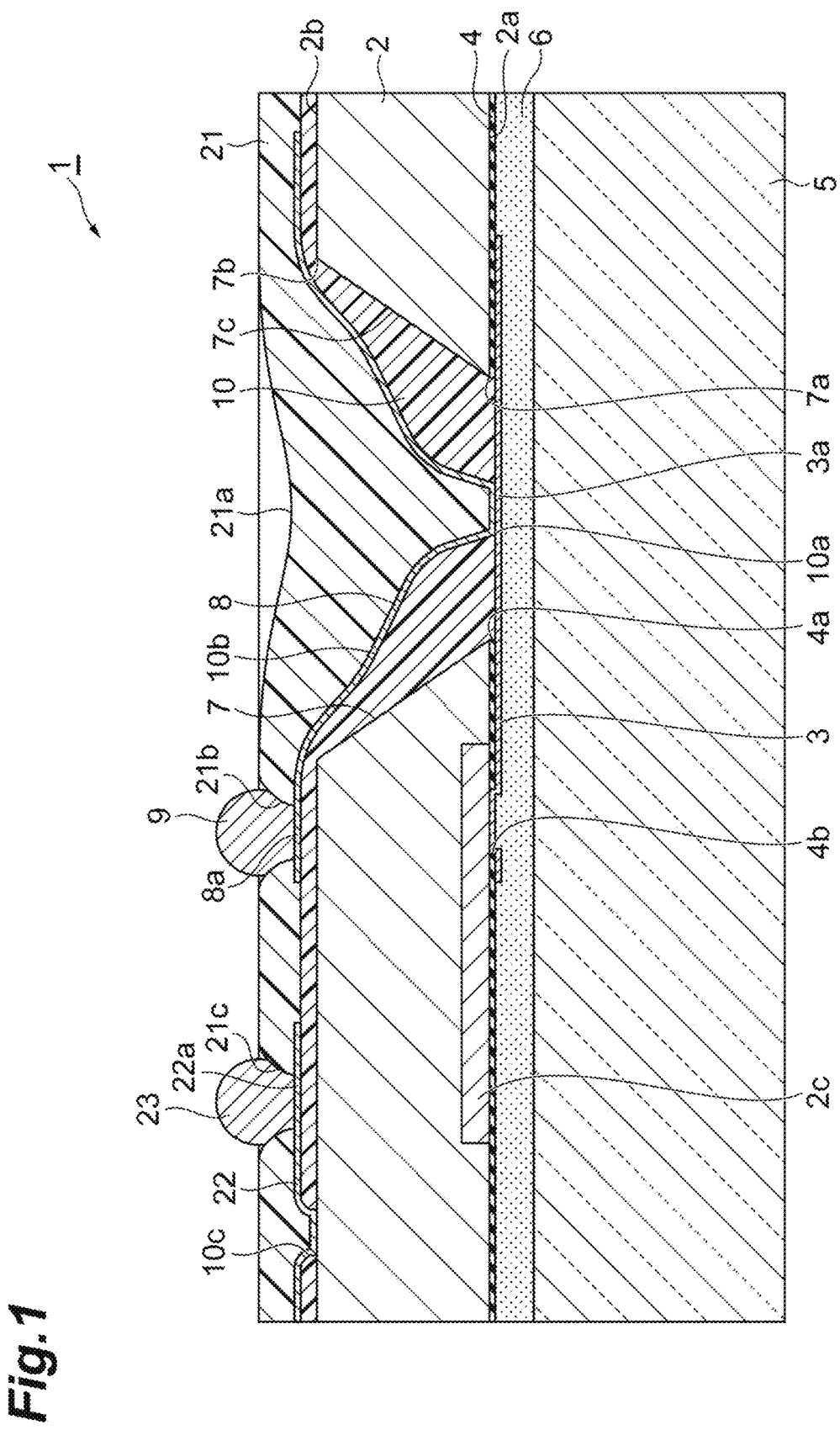
FIG. 1 is a cross-sectional view of a semiconductor device according to an embodiment of the present invention.
Figure 3:
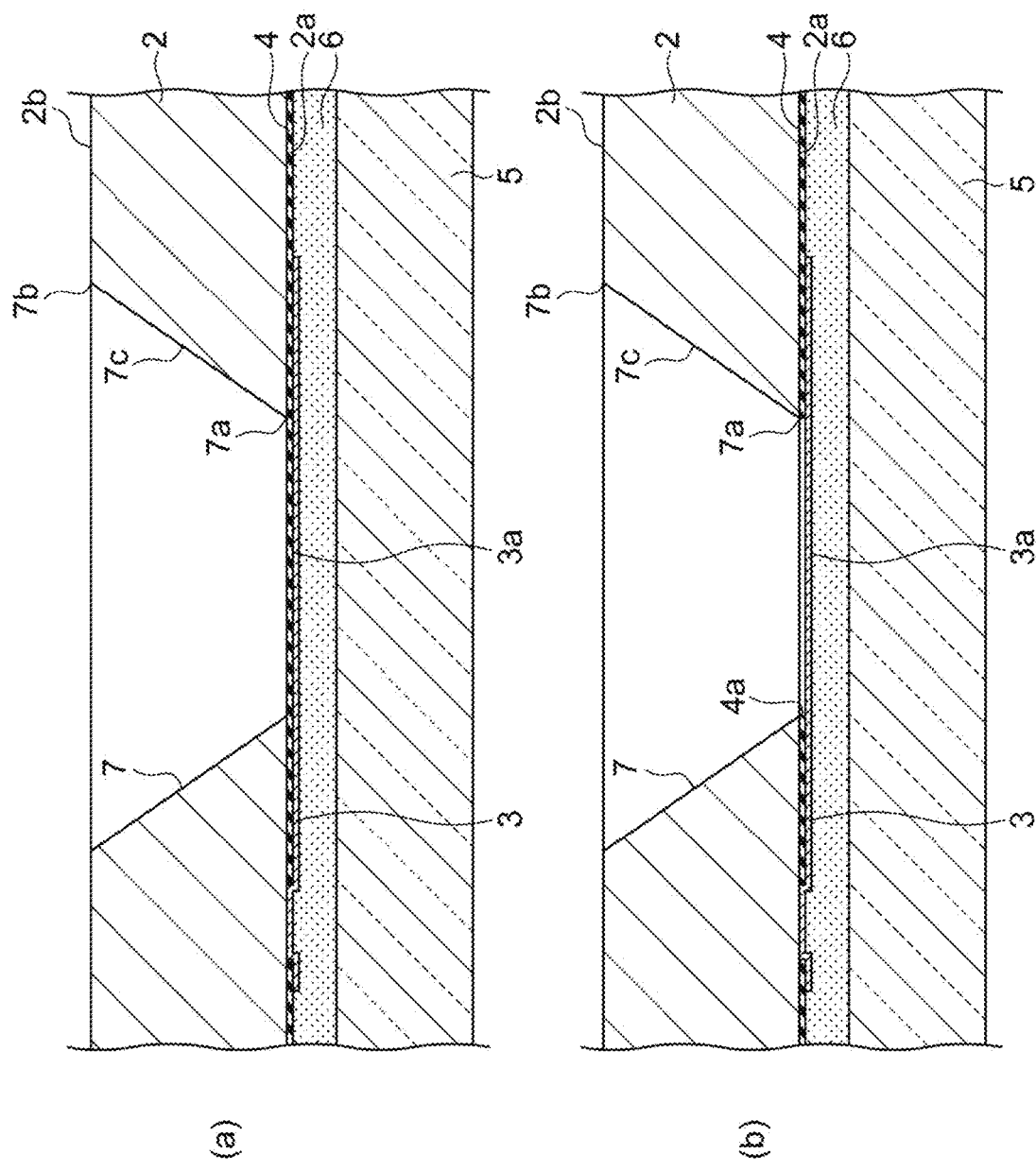

(a) and (b) of FIG. 3 are cross-sectional views for describing a plurality of processes in a method of manufacturing the semiconductor device in FIG. 1.

Figure 4:
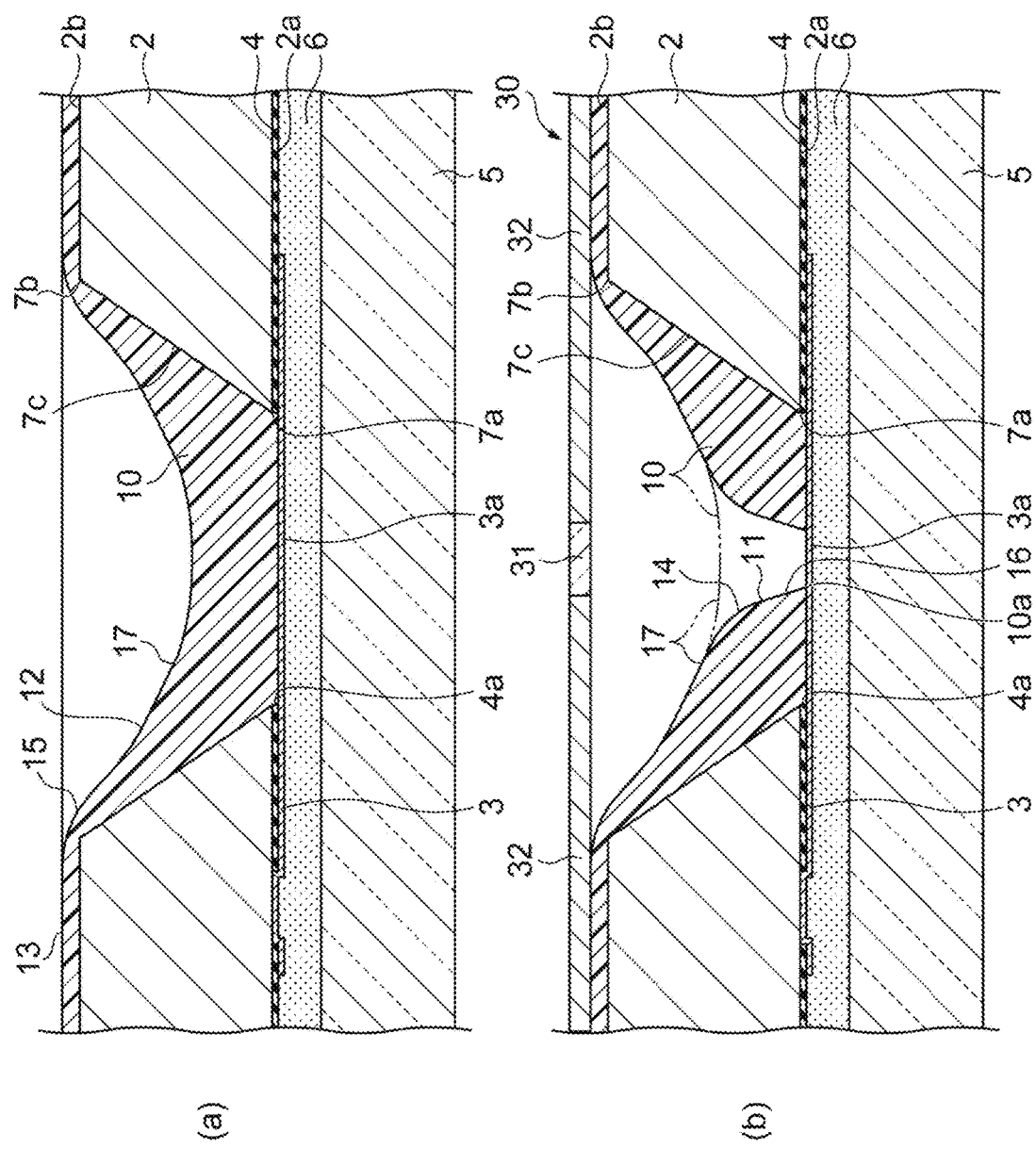

(a) and (b) of FIG. 4 are cross-sectional views for describing a plurality of processes in the method of manufacturing the semiconductor device in FIG. 1.

Figure 5:
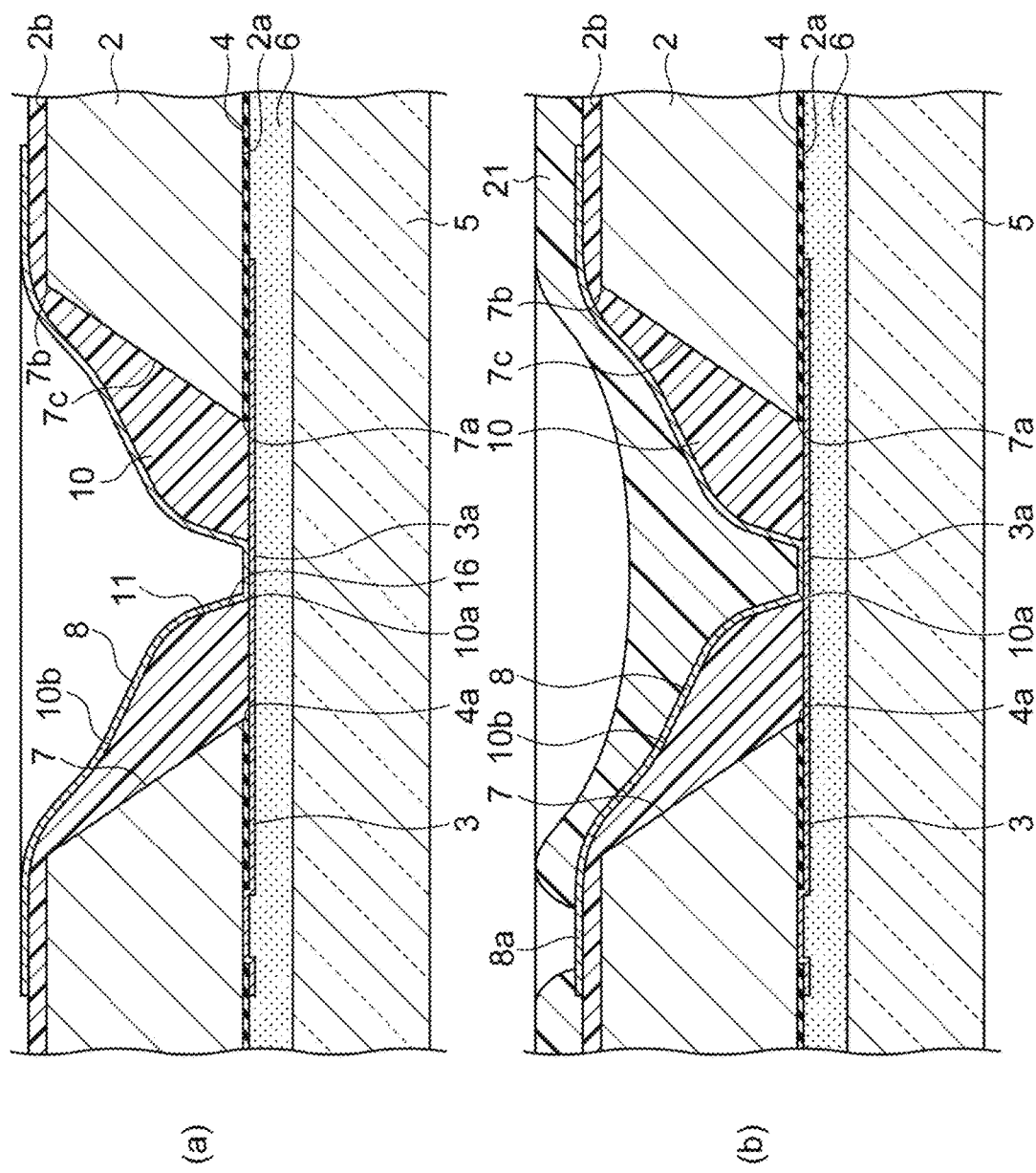

(a) and (b) of FIG. 5 are cross-sectional views for describing a plurality of processes in the method of manufacturing the semiconductor device in FIG. 1.

Figure 6:
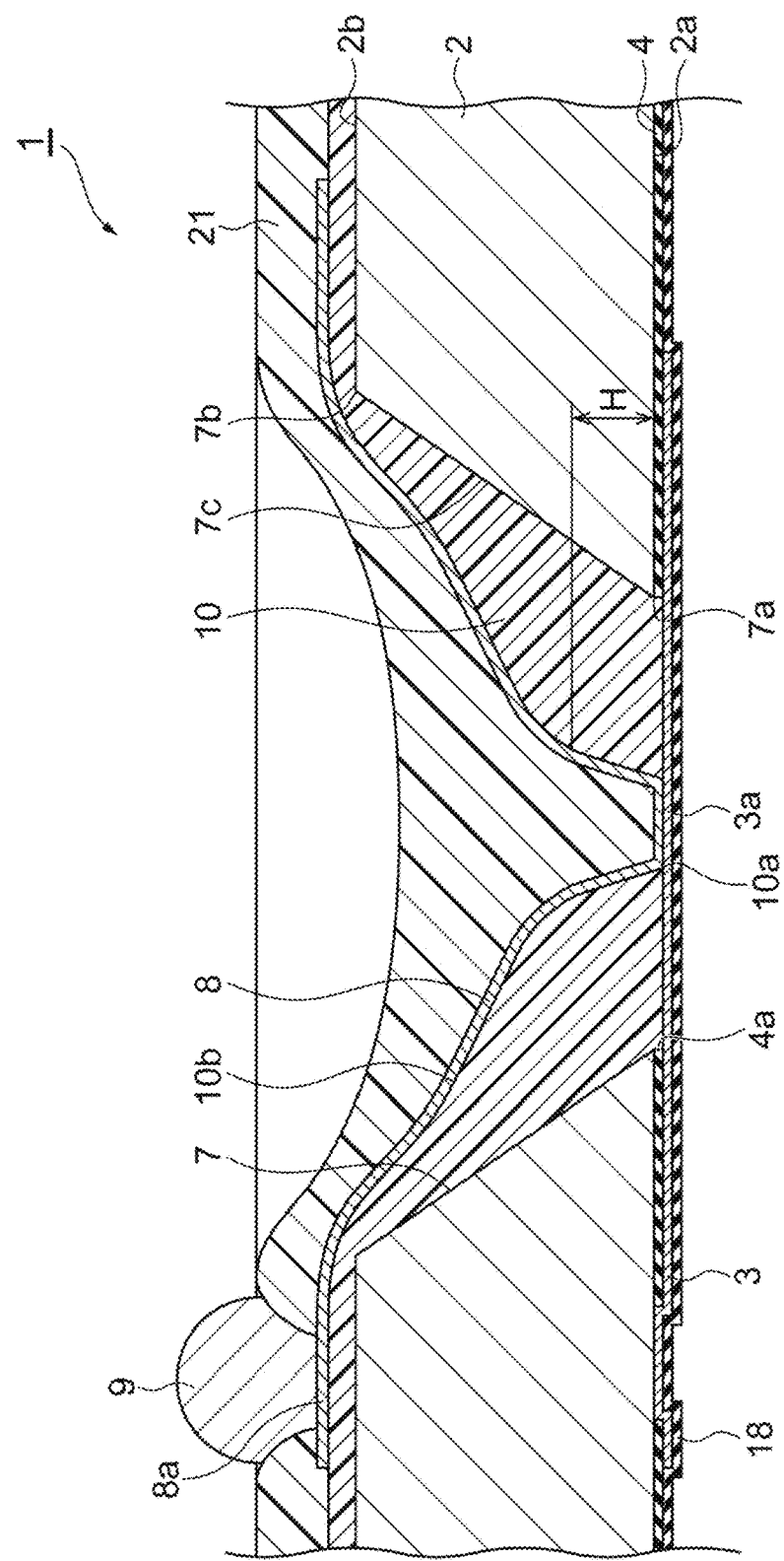

FIG. 6 is a partial cross-sectional view of a modified example of the semiconductor device in FIG. 1.

Figure 7:
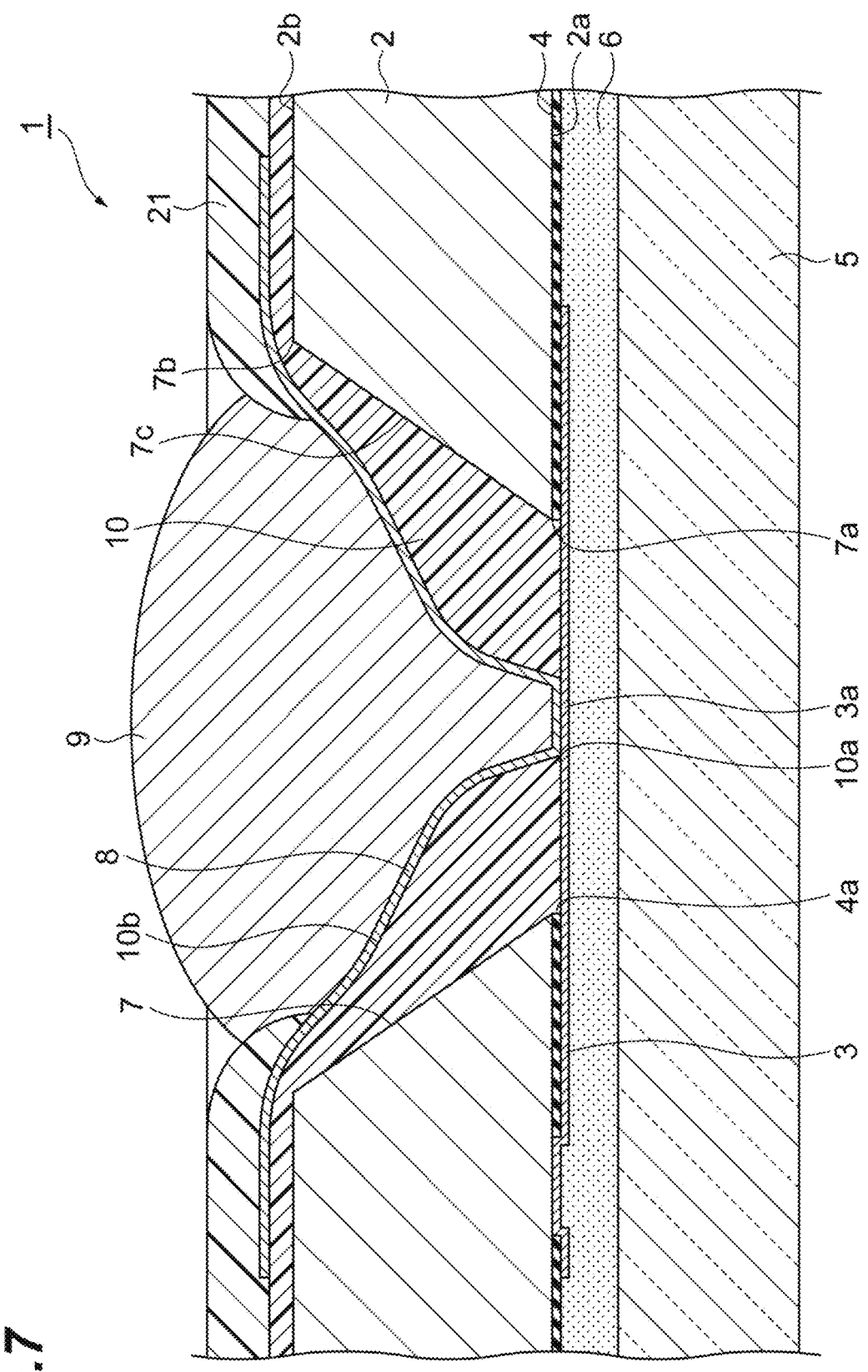

FIG. 7 is a partial cross-sectional view of a modified example of the semiconductor device in FIG. 1.

Figure 8:
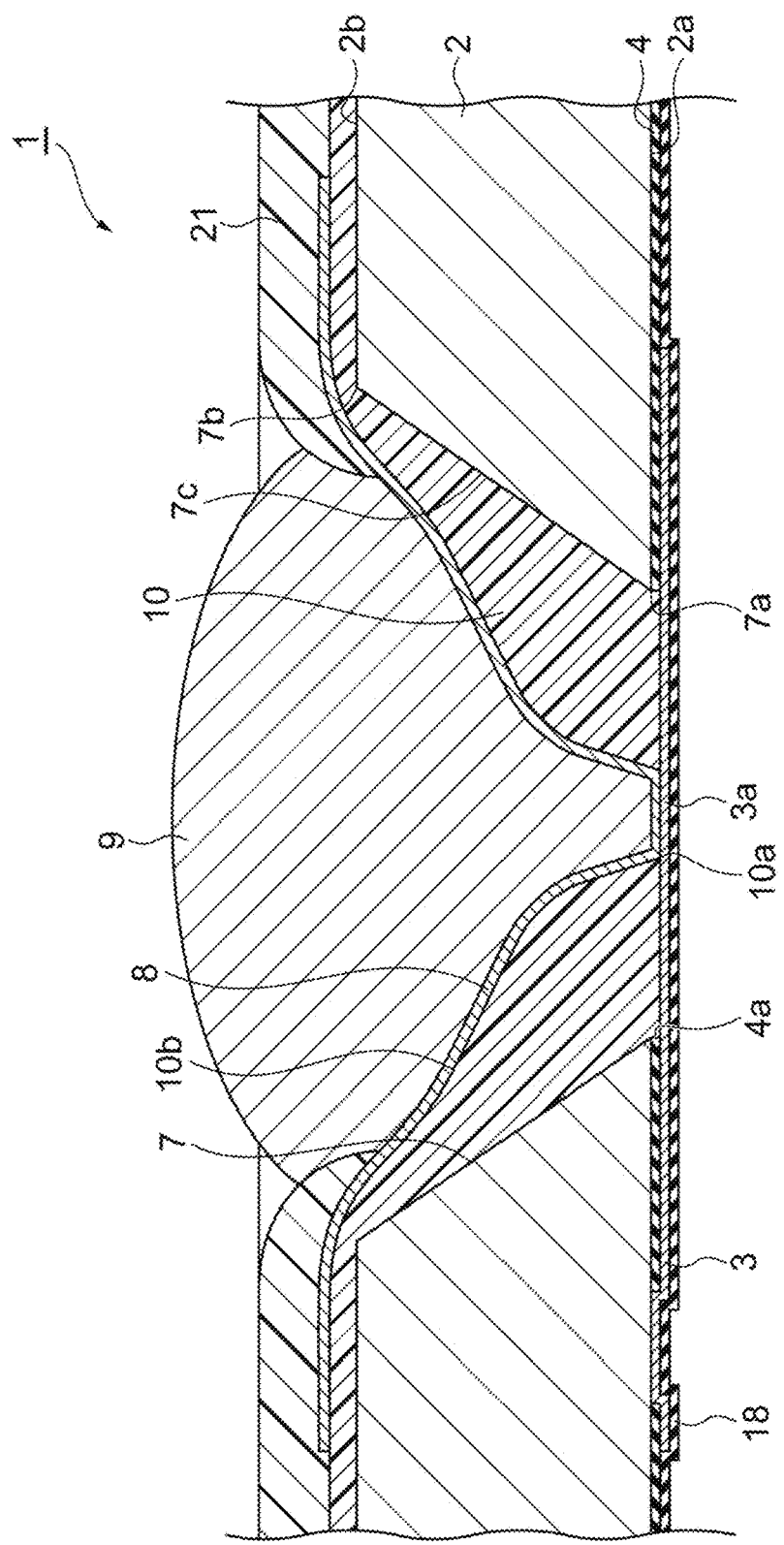

FIG. 8 is a partial cross-sectional view of a modified example of the semiconductor device in FIG. 1.

Figure 9:
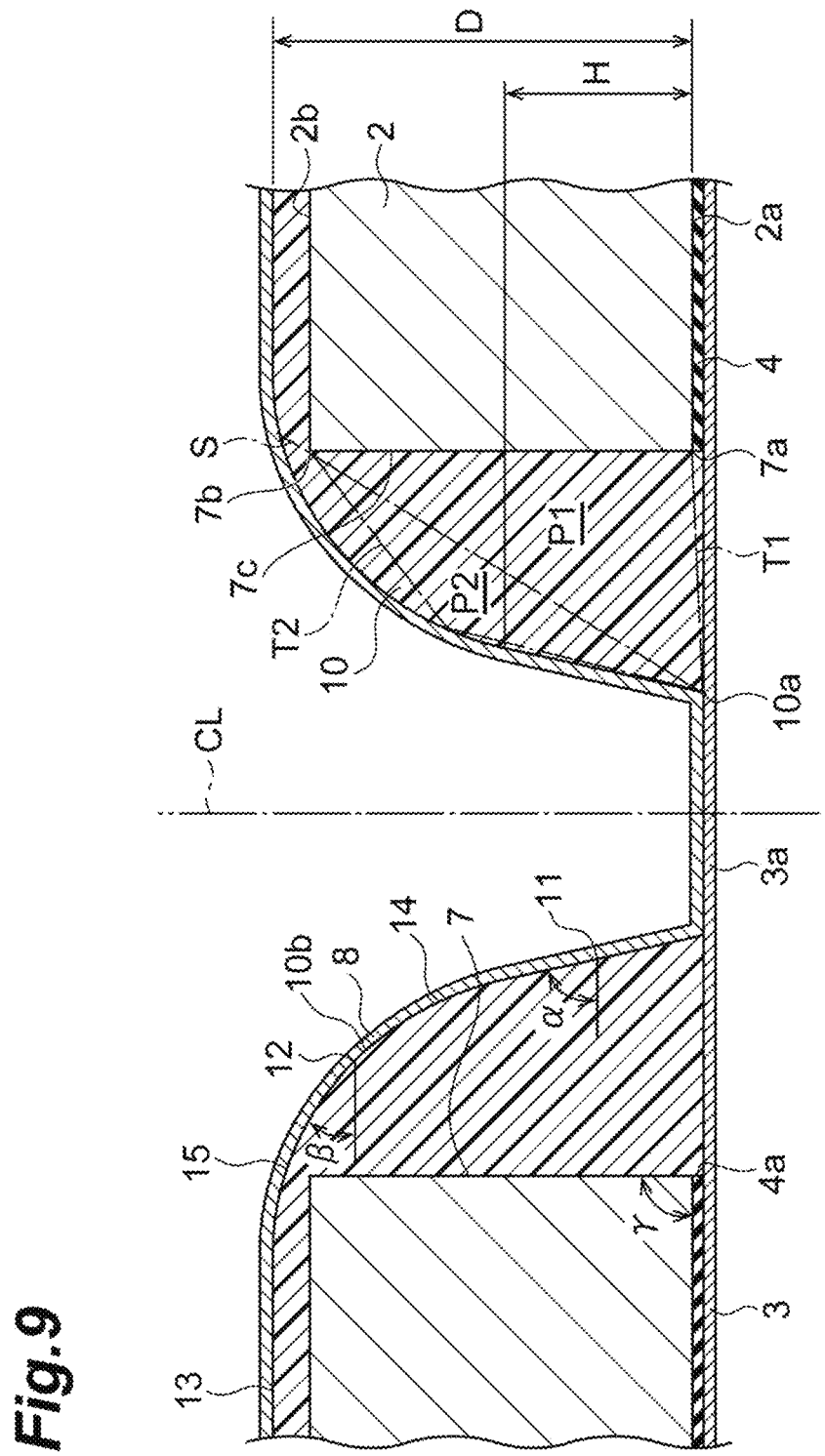

FIG. 9 is a cross-sectional view of a modified example of a through hole of the semiconductor device in FIG. 1 and a peripheral portion thereof.

DESCRIPTION OF EMBODIMENTS

Embodiments of the present invention will be described below in detail with reference to the drawings. Here, the same or corresponding portions in the drawings are denoted with the same reference numerals and redundant descriptions thereof will be omitted.

As shown in FIG. 1, a semiconductor device 1 includes a semiconductor substrate 2 including a first surface 2a and a second surface 2b that are opposite to each other. The semiconductor device 1 is an optical device, for example, a silicon photodiode. In the semiconductor device 1, in a predetermined region on the first surface 2a side in the semiconductor substrate 2 made of, for example, N-type silicon, a P-type region 2c in which P-type impurities are selectively diffused is provided. On the first surface 2a of the semiconductor substrate 2, a first wiring 3 made of, for example, aluminum, is provided with an oxide film 4 therebetween. In the oxide film 4, an opening 4a is formed in a portion corresponding to a pad portion 3a of the first wiring 3. An opening 4b is formed in a portion corresponding to an end of the P-type region 2c in the oxide film 4. The first wiring 3 is electrically connected to the P-type region 2c through the opening 4b. Here, instead of the oxide film 4, an insulating film made of another insulating material such as SiN may be provided.

A light transmitting substrate 5 made of a light transmitting material such as glass is arranged on the first surface 2a of the semiconductor substrate 2. The semiconductor substrate 2 and the light transmitting substrate 5 are optically and physically connected by an adhesive layer 6 including an optical adhesive. In the semiconductor device 1, light enters the P-type region 2c through the light transmitting substrate 5 and the adhesive layer 6. Here, the thickness of the semiconductor substrate 2 is smaller (thinner) than the thickness of the light transmitting substrate 5. As an example, the thickness of the semiconductor substrate 2 is about several tens of μm, and the thickness of the light transmitting substrate 5 is about several hundreds of μm.

In the semiconductor substrate 2, a through hole 7 to extend from the first surface 2a to the second surface 2b is formed. A first opening 7a of the through hole 7 is positioned on the first surface 2a of the semiconductor substrate 2, and a second opening 7b of the through hole 7 is positioned on the second surface 2b of the semiconductor substrate 2. The first opening 7a is continuous with the opening 4a of the oxide film 4 and is covered with the pad portion 3a of the first wiring 3. An inner surface 7c of the through hole 7 is a tapered surface that enlarges from the first surface 2a to the second surface 2b. For example, the through hole 7 is formed in a truncated quadrangular pyramid shape that enlarges from the first surface 2a to the second surface 2b. Here, when viewed in a direction parallel to a center line CL of the through hole 7, there is no need to match an edge of the first opening 7a of the through hole 7 and an edge of the opening 4a of the oxide film 4. For example, the edge of the opening 4a of the oxide film 4 may be positioned further inside than the edge of the first opening 7a of the through hole 7.

The aspect ratio of the through hole 7 is 0.2 to 10. The aspect ratio is a value obtained by dividing the depth of the through hole 7 (the distance between the first opening 7a and the second opening 7b) by the width of the second opening 7b (the distance between opposite sides of the second opening 7b when the second opening 7b has a rectangular shape, and the diameter of the second opening 7b when the second opening 7b has a circular shape). As an example, the depth of the through hole 7 is 30 μm, and the width of the second opening 7b is 130 μm. In this case, the aspect ratio is 0.23.

An insulating layer 10 is provided on the inner surface 7c of the through hole 7 and the second surface 2b of the semiconductor substrate 2. The insulating layer 10 is continuous through the second opening 7b of the through hole 7. The insulating layer 10 reaches the pad portion 3a of the first wiring 3 through the opening 4a of the oxide film 4 inside the through hole 7 and has an opening 10a on the first surface 2a side of the semiconductor substrate 2.

On a surface 10b (a surface on the side opposite the inner surface 7c of the through hole 7 and the second surface 2b of the semiconductor substrate 2) of the insulating layer 10, a second wiring 8 made of, for example, aluminum, is provided. The second wiring 8 is electrically connected to the pad portion 3a of the first wiring 3 in the opening 10a of the insulating layer 10. Further, on the surface 10b (a surface on the side opposite the second surface 2b of the semiconductor substrate 2) of the insulating layer 10, a third wiring 22 made of, for example, aluminum, is provided. The third wiring 22 is electrically connected to the second surface 2b of the semiconductor substrate 2 in an opening 10c formed in the insulating layer 10.

The second wiring 8 and the third wiring 22 are covered with a resin protective layer 21. A shallow recess 21a having a smooth inner surface is formed in a portion corresponding to the through hole 7 in the resin protective layer 21. An opening 21b for exposing a pad portion 8a is formed in a portion corresponding to the pad portion 8a of the second wiring 8 in the resin protective layer 21. An opening 21c for exposing the pad portion 22a is formed in a portion corresponding to a pad portion 22a of the third wiring 22 in the resin protective layer 21. In the opening 21b of the resin protective layer 21, an extraction electrode 9 that is a bump electrode is arranged. The extraction electrode 9 is electrically connected to the pad portion 8a of the second wiring 8. In the opening 21c of the resin protective layer 21, an extraction electrode 23 that is a bump electrode is arranged. The extraction electrode 23 is electrically connected to the pad portion 22a of the third wiring 22. The semiconductor device 1 is mounted on a circuit substrate through the extraction electrode 9 and the extraction electrode 23. The extraction electrode 9 and the extraction electrode 23 function as an anode electrode and a cathode electrode, respectively. Here, instead of the resin protective layer 21, a protective layer (for example, an oxide film and a nitride film) made of another insulating material may be provided. In addition, the thickness of the resin protective layer 21 may be almost the same as the thickness of the insulating layer 10 or may be smaller than the thickness of the insulating layer 10. In particular, when the thickness of the resin protective layer 21 is almost the same as the thickness of the insulating layer 10, it is possible to reduce stress applied to the second wiring 8 and the third wiring 22.

The insulating layer 10 described above will be described in further detail with reference to FIG. 2. Here, in FIG. 2, the light transmitting substrate 5, the adhesive layer 6, the extraction electrode 9, and the resin protective layer 21 are not shown.

Figure 2:
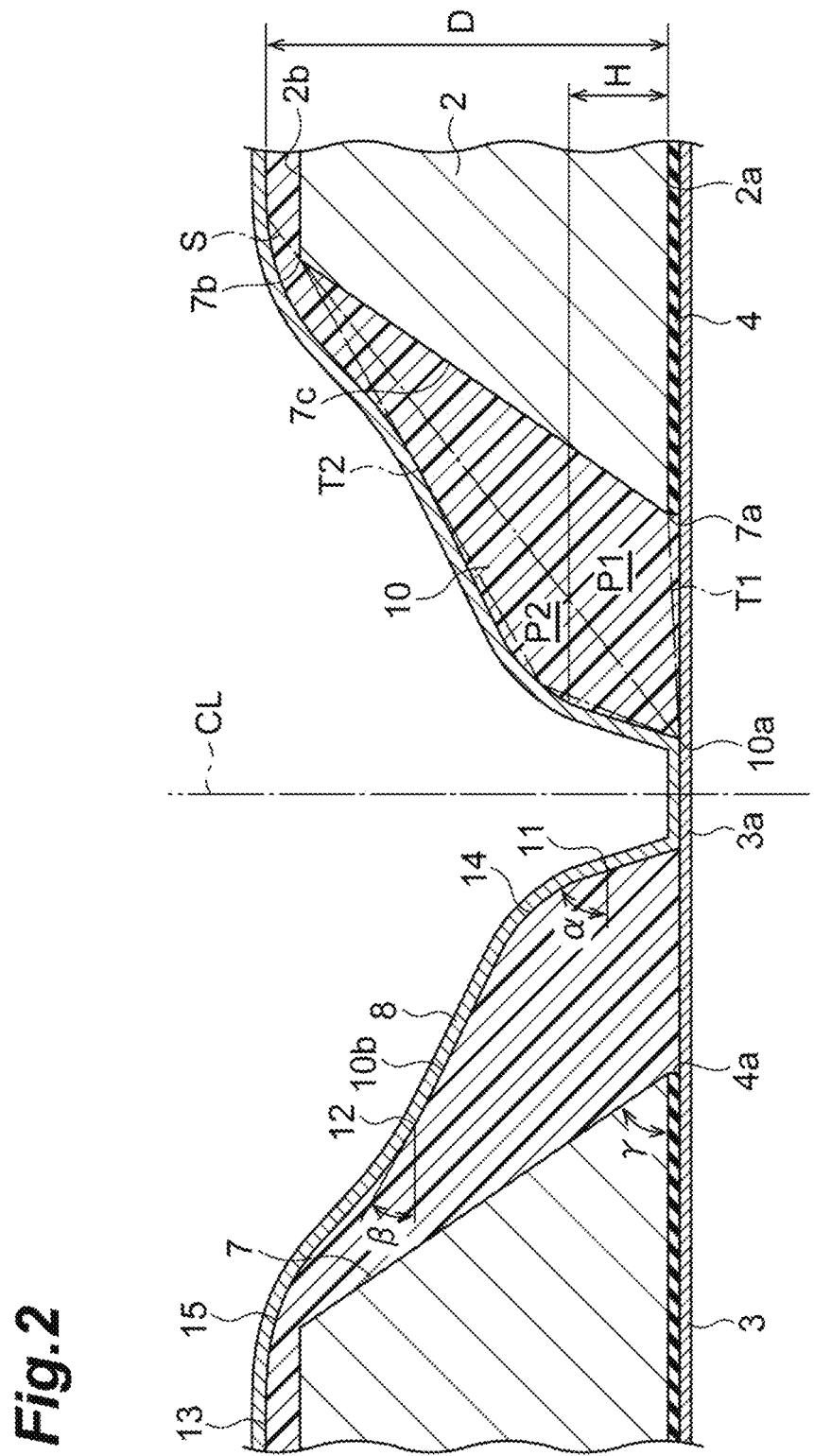
FIG. 2 is a cross-sectional view of a through hole of the semiconductor device in FIG. 1 and a peripheral portion thereof.

As shown in FIG. 2, the surface 10b of the insulating layer 10 has a first region 11 that reaches the first opening 7a inside the through hole 7, a second region 12 that reaches the second opening 7b inside the through hole 7, and a third region 13 that faces the second surface 2b of the semiconductor substrate 2 outside the through hole 7.

The first region 11 is a tapered region that enlarges from the first surface 2a to the second surface 2b of the semiconductor substrate 2. The first region 11 has an average inclination angle α. When attention is paid to a region on one side of the center line CL in the plane including the center line CL of the through hole 7, the average inclination angle α of the first region 11 is an average value of angles formed between an intersection line between the plane and the first region 11, and the first surface 2a. When the intersection line is a straight line, an angle between the straight line and the first surface 2a is the average inclination angle α of the first region 11. When the intersection line is a curved line, an average value of angles between the tangent of the curved line and the first surface 2a is the average inclination angle α of the first region 11. The average inclination angle α of the first region 11 is greater than 0° and smaller than 90°.

The second region 12 is a tapered region that enlarges from the first surface 2a to the second surface 2b of the semiconductor substrate 2. The second region 12 has an average inclination angle β. When attention is paid to a region on one side of the center line CL in the plane including the center line CL of the through hole 7, the average inclination angle β of the second region 12 is an average value of angles between an intersection line between the plane and the second region 12, and the first surface 2a. When the intersection line is a straight line, an angle between the straight line and the first surface 2a is the average inclination angle β of the second region 12. When the intersection line is a curved line, an average value of angles between the tangent of the curved line and the first surface 2a is the average inclination angle β of the second region 12. The average inclination angle β of the second region 12 is greater than 0° and smaller than 90°.

The average inclination angle β of the second region 12 is smaller than the average inclination angle α of the first region 11. That is, the second region 12 is a region having a gentler inclination than the first region 11. In addition, the average inclination angle β of the second region 12 is smaller than an average inclination angle γ of the inner surface 7c of the through hole 7. That is, the second region 12 is a region having a gentler inclination than the inner surface 7c of the through hole 7. In the present embodiment, the average inclination angle α of the first region 11 is closer to the average inclination angle γ of the inner surface 7c of the through hole 7 than the average inclination angle β of the second region 12. Here, the relationship of the average inclination angle α of the first region 11>the average inclination angle γ of the inner surface 7c of the through hole 7>the average inclination angle of the second region 12 is established. When attention is paid to a region on one side of the center line CL in the plane including the center line CL of the through hole 7, the average inclination angle γ of the inner surface 7c of the through hole 7 is an average value of angles between an intersection line between the plane and the inner surface 7c, and the first surface 2a. When the intersection line is a straight line, an angle between the straight line and the first surface 2a is the average inclination angle γ of the inner surface 7c of the through hole 7. When the intersection line is a curved line, an average value of angles between the tangent of the curved line and the first surface 2a is the average inclination angle γ of the inner surface 7c of the through hole 7.

The surface 10b of the insulating layer 10 further has a fourth region 14 having a maximum convex curvature toward the side opposite the inner surface 7c of the through hole 7 and a fifth region 15 along an edge of the second opening 7b of the through hole 7. When attention is paid to a region on one side of the center line CL in the plane including the center line CL of the through hole 7, the maximum convex curvature toward the side opposite the inner surface 7c of the through hole 7 is a maximum curvature value of a portion that is curved in a convex shape toward the side opposite the inner surface 7c of the through hole 7 along the intersection line between the plane and the surface 10b. Here, the first region 11 is a region on the first opening 7a side of the through hole 7 (the first opening 7a side in a direction parallel to the center line CL of the through hole 7) relative to the fourth region 14 within the surface 10b of the insulating layer 10 provided on the inner surface 7c of the through hole 7. The second region 12 is a region on the second opening 7b side of the through hole 7 (the second opening 7b side in a direction parallel to the center line CL of the through hole 7) relative to the fourth region 14 within the surface 10b of the insulating layer 10 provided on the inner surface 7c of the through hole 7 (that is, a region between the fourth region 14 and the fifth region 15).

The fourth region 14 is curved to continuously connect the first region 11 and the second region 12. That is, the fourth region 14 is a rounded curved surface and smoothly connects the first region 11 and the second region 12. Here, if it is assumed that the fourth region 14 is not provided, when the first region 11 is extended to the second surface 2b side of the semiconductor substrate 2, and the second region 12 is extended to the first surface 2a side of the semiconductor substrate 2, an intersection line (a corner or an angulated portion) is formed by the first region 11 and the second region 12. The fourth region 14 corresponds to a curved surface formed when the intersection line (a corner or an angulated portion) is round-chamfered. When attention is paid to a region on one side of the center line CL in the plane including the center line CL of the through hole 7, the fourth region 14 is a portion that is curved in a convex shape toward the side opposite the inner surface 7c of the through hole 7 between a portion corresponding to the first region 11 and a portion corresponding to the second region 12 along the intersection line between the plane and the surface 10b.

The fifth region 15 is curved to continuously connect the second region 12 and the third region 13. That is, the fifth region 15 is a rounded curved surface and smoothly connects the second region 12 and the third region 13. Here, if it is assumed that the fifth region 15 is not provided, when the second region 12 is extended to the second surface 2b side of the semiconductor substrate 2 and the third region 13 is extended to the center line CL of the through hole 7, an intersection line (such as a corner or an angulated portion) is formed by the second region 12 and the third region 13. The fifth region 15 corresponds to a curved surface for lied when the intersection line (such as a corner or an angulated portion) is round-chamfered. When attention is paid to a region on one side of the center line CL in the plane including the center line CL of the through hole 7, the fifth region 15 is a portion that is curved in a convex shape toward the side opposite the edge of the second opening 7b of the through hole 7 between the portion corresponding to the second region 12 and a portion corresponding to the third region 13 along the intersection line between the plane and the surface 10b.

In the present embodiment, the first region 11, the fourth region 14, and the fifth region 15 are curved surfaces that are curved in a convex shape toward the side opposite the inner surface 7c of the through hole 7. The second region 12 is a curved surface that is curved in a convex shape toward the inner surface 7c side of the through hole 7 (that is, a curved surface that is curved in a concave shape when viewed from the side opposite the inner surface 7c of the through hole 7). The third region 13 is a plane substantially parallel to the second surface 2b of the semiconductor substrate 2. As described above, the fourth region 14 is curved to continuously connect the first region 11 and the second region 12, and the fifth region 15 is curved to continuously connect the second region 12 and the third region 13. Therefore, the surface 10b of the insulating layer 10 is a continuous surface (a surface in which there is no discontinuous portion such as an intersection line (such as a corner or an angulated portion) between a surface and a surface, and the regions 11, 12, 13, 14, and 15 are smoothly connected).

An average thickness of the insulating layer 10 provided on the inner surface 7c of the through hole 7 is greater than an average thickness of the insulating layer 10 provided on the second surface 2b of the semiconductor substrate 2. The average thickness of the insulating layer 10 provided on the inner surface 7c of the through hole 7 is an average value of the thickness of the insulating layer 10 in a direction perpendicular to the inner surface 7c. The average thickness of the insulating layer 10 provided on the second surface 2b of the semiconductor substrate 2 is an average value of the thickness of the insulating layer 10 in a direction perpendicular to the second surface 2b.

In a direction parallel to the first surface 2a and the second surface 2b of the semiconductor substrate 2, an average thickness of the portion corresponding to the first region 11 within the insulating layer 10 is greater than an average thickness of the portion corresponding to the second region 12 within the insulating layer 10. In a direction parallel to the first surface 2a and the second surface 2b of the semiconductor substrate 2, an average thickness of the portion corresponding to the first region 11 within the insulating layer 10 is an average value of a distance between the first region 11 and the inner surface 7c of the through hole 7 in that direction. In a direction parallel to the first surface 2a and the second surface 2b of the semiconductor substrate 2, an average thickness of the portion corresponding to the second region 12 within the insulating layer 10 is an average value of a distance between the second region 12 and the inner surface 7c of the through hole 7 in that direction.

In the insulating layer 10, the first region 11 is a surface of a portion having a height H from the first surface 2a of the semiconductor substrate 2 within the insulating layer 10 provided on the inner surface 7c of the through hole 7. The height H is ½ of a sum D of the thickness of the semiconductor substrate 2 (that is, a distance between the first surface 2a and the second surface 2b) and the average thickness of the insulating layer 10 provided on the second surface 2b of the semiconductor substrate 2 or less.

In the insulating layer 10, when a surface S passing through an edge of the opening 10a of the insulating layer 10 and the edge of the second opening 7b of the through hole 7 is set as a boundary surface, and a portion P1 on the inner surface 7c side of the through hole 7 with respect to the surface S and a portion P2 on the side opposite the inner surface 7c of the through hole 7 with respect to the surface S are focused on, the volume of the portion P1 is larger than the volume of the portion P2. In addition, in the insulating layer 10, when attention is paid to a region on one side of the center line CL in the plane including the center line CL of the through hole 7, an area of a triangle T1 is larger than an area of a triangle T2. The triangle T1 is a triangle with vertices at the edge of the first opening 7a of the through hole 7, the edge of the second opening 7b of the through hole 7, and the edge of the opening 10a of the insulating layer 10 on a plane including the center line CL of the through hole 7 (that is, in the cross section in FIG. 2). The triangle T2 is a triangle with vertices at the edge of the opening 10a of the insulating layer 10, the edge of the second opening 7b of the through hole 7, and the top of the fourth region 14 on a plane including the center line CL of the through hole 7 (that is, in the cross section in FIG. 2).

As described above, in the semiconductor device 1, the first region 11 that reaches the first opening 7a of the through hole 7 and the second region 12 that reaches the second opening 7b of the through hole 7 within the surface 10b of the insulating layer 10 are tapered regions that enlarge from the first surface 2a to the second surface 2b of the semiconductor substrate 2. Thus, the average inclination angle of the second region 12 is smaller than an average inclination angle of the inner surface 7c of the through hole 7. Accordingly, an angle between the third region 13 that faces the second surface 2b of the semiconductor substrate 2 and the second region 12 that reaches the second opening 7b of the through hole 7 within the surface 10b of the insulating layer 10 is greater (that is, gentler) than an angle between the second surface 2b of the semiconductor substrate 2 and the inner surface 7c of the through hole 7. Therefore, during manufacture and after manufacture, a disconnection of the second wiring 8 in a portion of the second opening 7b of the through hole 7 is prevented. In addition, for example, compared to when the insulating layer 10 is formed with a uniform thickness along the inner surface 7c of the through hole 7, since the inclination of the second region 12 becomes gentler, it is possible to form the second wiring 8 easily and reliably. Further, since it is possible to form the second wiring 8 without depending on the shape of the inner surface 7c of the through hole 7, for example, even if a pointed portion remains on the inner surface 7c of the through hole 7, it is possible to prevent a disconnection of the second wiring 8 caused by such a portion. In addition, the average inclination angle of the second region 12 is smaller than the average inclination angle of the first region 11. In other words, the average inclination angle of the first region 11 that reaches the first opening 7a of the through hole 7 is greater than the average inclination angle of the second region 12. Accordingly, for example, even if the diameter of the through hole 7 is reduced, a sufficient area of the opening 10a of the insulating layer 10 on the first surface 2a side of the semiconductor substrate 2 is ensured. Therefore, during manufacture and after manufacture, a disconnection between the first wiring 3 and the second wiring 8 in a portion of the opening 10a of the insulating layer 10 is prevented. Further, on the surface 10b of the insulating layer 10, the fourth region 14 is curved to continuously connect the first region 11 and the second region 12, and the fifth region 15 is curved to continuously connect the second region 12 and the third region 13. Therefore, during manufacture and after manufacture, a disconnection of the second wiring 8 is prevented in the entire region of the surface 10b of the insulating layer 10. In particular, after manufacture, since the stress concentration in the entire region of the surface 10b of the insulating layer 10 is reduced, it is effective to prevent a disconnection of the second wiring 8. As described above, according to the semiconductor device 1, a reliable electrical connection via the through hole 7 in the semiconductor substrate 2 can be formed.

In the semiconductor device 1, the surface 10b of the insulating layer 10 is a continuous surface (a surface in which there is no discontinuous portion such as an intersection line (such as a corner or a bent portion) between a surface and a surface, and the regions 11, 12, 13, 14, and 15 are smoothly connected). Accordingly, the stress concentration is reduced so that a disconnection of the second wiring 8 can be prevented.

In the semiconductor device 1, the average inclination angle of the first region 11 is closer to the average inclination angle of the inner surface 7c of the through hole 7 than the average inclination angle of the second region 12. Accordingly, it is possible to obtain the opening 10a having a sufficient area for exposing the pad portion 3a of the first wiring 3. As a result, during manufacture and after manufacture, it is possible to prevent a disconnection between the first wiring 3 and the second wiring 8 in a portion of the opening 10a of the insulating layer 10 more reliably.

In the semiconductor device 1, the relationship of the average inclination angle α of the first region 11>the average inclination angle γ of the inner surface 7c of the through hole 7>the average inclination angle β of the second region 12 is established. Accordingly, it is possible to prevent a disconnection of the second wiring 8 and it is possible to obtain the opening 10a having a sufficient area for exposing the pad portion 3a of the first wiring 3.

In the semiconductor device 1, the average thickness of the insulating layer 10 provided on the inner surface 7c of the through hole 7 is greater than the average thickness of the insulating layer 10 provided on the second surface 2b. Accordingly, for example, even if the semiconductor substrate 2 is thinned, since the insulating layer 10 provided on the inner surface 7c of the through hole 7 functions as a reinforcing layer, it is possible to ensure sufficient strength of a peripheral portion of the through hole 7. In addition, it is possible to set an average inclination angle of the first region 11 and an average inclination angle of the second region 12 to a desired angle, and it is possible to obtain the insulating layer 10 in which the surface 10b is a continuous surface (a surface in which there is no discontinuous portion such as an intersection line (such as a corner or a bent portion) between a surface and a surface, and the regions 11, 12, 13, 14, and 15 are smoothly connected). For example, when the insulating layer 10 is formed with a uniform thickness along the inner surface 7c of the through hole 7, it is not possible to obtain the insulating layer 10 in which the surface 10b is a continuous surface.

In the semiconductor device 1, in a direction parallel to the first surface 2a and the second surface 2b of the semiconductor substrate 2, an average thickness of the portion corresponding to the first region 11 within the insulating layer 10 is greater than an average thickness of the portion corresponding to the second region 12 within the insulating layer 10. Accordingly, it is possible to obtain the insulating layer 10 having a shape in which a disconnection of the second wiring 8 does not easily occur and a disconnection between the first wiring 3 and the second wiring 8 does not easily occur.

In the semiconductor device 1, for example, even if an overhang or the like remains on the edge of the second opening 7b of the through hole 7, the overhang or the like is covered with the insulating layer 10, and the second wiring 8 is provided on the fifth region 15 that is a curved surface curved in a convex shape. Accordingly, it is possible to reliably prevent a disconnection of the second wiring 8 in a portion of the second opening 7b of the through hole 7.

In the semiconductor device 1, within the insulating layer 10 provided on the inner surface 7c of the through hole 7, a surface of a portion having a height H that is ½ of a sum D of the thickness of the semiconductor substrate 2 and the average thickness of the insulating layer 10 provided on the second surface 2b or less is the first region 11. Accordingly, on the surface 10b of the insulating layer 10, the first region 11 and the second region 12 are smoothly connected, and it is possible to reliably prevent a disconnection of the second wiring 8 at a boundary between the first region 11 and the second region 12.

In the insulating layer 10 of the semiconductor device 1, when the surface S passing through the edge of the opening 10a of the insulating layer 10 and the edge of the second opening 7b of the through hole 7 is set as a boundary surface, and the portion P1 on the inner surface 7c side of the through hole 7 with respect to the surface S and the portion P2 on the side opposite the inner surface 7c of the through hole 7 with respect to the surface S are focused on, the volume of the portion P1 is larger than the volume of the portion P2. In addition, when attention is paid to a region on one side of the center line CL in the plane including the center line CL of the through hole 7, the area of the triangle T1 is larger than the area of the triangle T2. Accordingly, on the surface 10b of the insulating layer 10, the first region 11 and the second region 12 are smoothly connected, and it is possible to reliably prevent a disconnection of the second wiring 8 at a boundary between the first region 11 and the second region 12.

In the semiconductor device 1, within the surface 10b of the insulating layer 10 provided on the inner surface 7c of the through hole 7, a region on the first opening 7a side relative to the fourth region 14 having the maximum convex curvature toward the side opposite the inner surface 7c of the through hole 7 is the first region 11, and a region on the second opening 7b side relative to the fourth region 14 is the second region 12. Such a shape of the insulating layer 10 is particularly effective for forming a reliable electrical connection via the through hole 7 in the semiconductor substrate 2.

In the semiconductor device 1, the inner surface 7c of the through hole 7 is a tapered surface that enlarges from the first surface 2a to the second surface 2b. In this case, a reliable electrical connection via the through hole 7 in the semiconductor substrate 2 can be formed.

In the semiconductor device 1, the insulating layer 10 is made of a resin. Accordingly, it is possible to form the insulating layer 10 having the shape described above easily and reliably.

Next, a method of manufacturing the semiconductor device 1 described above will be described with reference to FIG. 3 to FIG. 5. First, the semiconductor substrate 2 is prepared, and a device is formed on the first surface 2a of the semiconductor substrate 2 (that is, the oxide film 4, the first wiring 3, and the like are provided on the first surface 2a) (first process). Then, the light transmitting substrate 5 is attached to the first surface 2a of the semiconductor substrate 2 with the adhesive layer 6 therebetween.

Subsequently, as shown in (a) of FIG. 3, the through hole 7 is formed in the semiconductor substrate 2 by anisotropic wet etching. Further, as shown in (b) of FIG. 3, a portion corresponding to the pad portion 3a of the first wiring 3 in the oxide film 4 is removed, and the opening 4a is formed in the oxide film 4. Accordingly, the pad portion 3a of the first wiring 3 is exposed to the first opening 7a of the through hole 7 (second process). Here, when viewed in a direction parallel to the center line CL of the through hole 7, there is no need to form the opening 4a in the oxide film 4 to match the edge of the first opening 7a of the through hole 7 and, for example, the opening 4a may be formed in the oxide film 4 so that the edge of the opening 4a of the oxide film 4 is positioned further inside than the edge of the first opening 7a of the through hole 7.

Subsequently, a positive resin material having a viscosity of 10 cp or more is prepared, and a dip coating method (a method of immersing an object in a resin paint, pulling the object out of the resin paint, and thus forming a resin layer on the object) is performed using the resin material, and thus, as shown in (a) of FIG. 4, the insulating layer 10 is provided on the inner surface 7c of the through hole 7 and the second surface 2b of the semiconductor substrate 2 (third process). Accordingly, in the insulating layer 10, a recess 17 having an inner surface that follows the second region 12, the third region 13, and the fifth region 15 is formed. Here, as the resin material, for example, a phenolic resin, a polyimide resin, or an epoxy resin can be used.

Subsequently, as shown in (b) of FIG. 4, a mask 30 is arranged on the insulating layer 10 provided on the second surface 2b of the semiconductor substrate 2. The mask 30 has a light transmitting portion 31 at a position that faces the pad portion 3a of the first wiring 3 and a light blocking portion 32 around the light transmitting portion 31. Subsequently, light is emitted to a portion corresponding to the contact hole 16 in the insulating layer 10 through the light transmitting portion 31 of the mask 30 and the portion is exposed. Further, when the portion corresponding to the contact hole 16 in the insulating layer 10 is developed, the contact hole 16 is formed in the insulating layer 10. Accordingly, the pad portion 3a of the first wiring 3 is exposed to the opening 10a of the insulating layer 10 (fourth process). Here, when the contact hole 16 is formed, an ashing treatment may be performed in combination.

During exposure, a gap is formed due to the recess 17 formed in the insulating layer 10 between the light transmitting portion 31 of the mask 30 and the portion corresponding to the contact hole 16 in the insulating layer 10. Accordingly, light is diffracted and emitted to the insulating layer 10. Therefore, during development, the tapered first region 11 that enlarges from the first surface 2a to the second surface 2b of the semiconductor substrate 2 and the contact hole 16 having an inner surface that follows the second region 12 are formed.

Subsequently, as shown in (a) of FIG. 5, for example, when a sputtering method using aluminum is performed, the second wiling 8 is provided on the surface 10b of the insulating layer 10, and the first wiring 3 and the second wiring 8 are electrically connected in the opening 10a of the insulating layer 10 (fifth process). In this case, since the contact hole 16 has an inner surface following the tapered first region 11 that enlarges from the first surface 2a to the second surface 2b of the semiconductor substrate, a metal film is also reliably formed on the inner surface, and additionally, the first wiring 3 and the second wiring 8 are reliably connected in the opening 10a of the insulating layer 10.

Subsequently, for example, a dip coating method is performed using the same resin material as that of the insulating layer 10, and thus, as shown in (b) of FIG. 5, the second wiring 8 is covered with the resin protective layer 21. Finally, the extraction electrode 9 is arranged in the pad portion 8a of the second wiring 8 that is not covered with the resin protective layer 21 and the semiconductor device 1 described above is obtained.

According to the method of manufacturing the semiconductor device 1, it is possible to efficiently manufacture the semiconductor device 1 in which a reliable electrical connection is formed via the through hole 7 in the semiconductor substrate 2.

In the method of manufacturing the semiconductor device 1, the dip coating method is performed using a resin material having a viscosity of 10 cp or more, and thus the insulating layer 10 is provided on the inner surface 7c of the through hole 7 and the second surface 2b of the semiconductor substrate 2. Accordingly, it is possible to obtain the insulating layer 10 having the shape described above easily and reliably.

Here, in the dip coating method, a low viscosity resin material (for example, a resin material used for a water repellent coating, for example, a resin material having a viscosity of 1 cp or less) is generally used. However, even if the dip coating method is performed using such a resin material, the insulating layer 10 is formed with substantially a uniform thickness along the inner surface 7c of the through hole 7. Thus, in the method of manufacturing the semiconductor device 1, when the dip coating method is performed using a resin material having a viscosity of 10 cp or more, it is possible to obtain the insulating layer 10 having the shape described above easily and reliably.

In the method of manufacturing the semiconductor device 1, using the positive resin material, the insulating layer 10 is provided on the inner surface 7c of the through hole 7 and the second surface 2b of the semiconductor substrate 2. Then, the portion corresponding to the contact hole 16 in the insulating layer 10 is exposed and developed, and thus the contact hole 16 is formed in the insulating layer 10. Accordingly, it is possible to obtain the insulating layer 10 having the shape described above easily and reliably. Here, during exposure and development, since the thickness of the portion corresponding to the contact hole 16 in the insulating layer 10 becomes thinner (that is, since the portion corresponding to the contact hole 16 is a portion having a height H of ½ of a sum D of the thickness of the semiconductor substrate 2 and the average thickness of the insulating layer 10 provided on the second surface 2b or less within the insulating layer 10) due to the recess 17 formed in the insulating layer 10, it is possible to obtain the contact hole 16 having a desired shape easily and reliably.

In the method of manufacturing the semiconductor device 1, while the light transmitting substrate 5 is attached to the semiconductor substrate 2, the dip coating method is performed. Thus, the thinned semiconductor substrate 2 can be used. In the thinned semiconductor substrate 2, since the depth of the through hole 7 is reduced, even if the insulating layer 10 is thickened according to the dip coating method using a resin material having a high viscosity at 10 cp or more, it is possible to form the contact hole 16 in the insulating layer 10 easily and reliably.

While one embodiment of the present invention has been described above, the present invention is not limited to the above embodiment. For example, the insulating layer 10 may be made of an insulating material other than a resin. In addition, while the first opening 7a of the through hole 7 is covered with the pad portion 3a of the first wiring 3 in the above embodiment, a portion of the first wiring 3 may be positioned above the first opening 7a, and the first wiring 3 may not cover the entire region of the first opening 7a.

In addition, in the above embodiment, the average inclination angle of the first region 11 is closer to the average inclination angle of the inner surface 7c of the through hole 7 than the average inclination angle of the second region 12. However, the average inclination angle of the second region 12 may be closer to the average inclination angle of the inner surface 7c of the through hole 7 than the average inclination angle of the first region 11.

In addition, as shown in FIG. 6, the light transmitting substrate 5 may not be attached to the first surface 2a of the semiconductor substrate 2 with the adhesive layer 6 therebetween. In this case, an oxide film 18 is provided on the first surface 2a to cover the first wiring 3. In this manner, when the light transmitting substrate 5 is not attached to the semiconductor substrate 2, since a portion having a height H from the first surface 2a in the insulating layer 10 functions as a reinforcing layer, this is particularly effective in consideration of ensuring sufficient strength of a peripheral portion of the through hole 7.

In addition, as shown in FIG. 7 and FIG. 8, the extraction electrode 9 may be arranged inside the through hole 7 to protrude from the second surface 2b of the semiconductor substrate 2. In this case, as shown in FIG. 7, the light transmitting substrate 5 may be attached to the first surface 2a of the semiconductor substrate 2 with the adhesive layer 6 therebetween. Alternatively, as shown in FIG. 8, the light transmitting substrate 5 may not be attached to the first surface 2a of the semiconductor substrate 2 with the adhesive layer 6 therebetween.

In addition, as shown in FIG. 9, the inner surface 7c of the through hole 7 (when the inner surface 7c of the through hole 7 is a curved surface such as a cylindrical surface, the tangential plane of the curved surface) may be a surface orthogonal to the first surface 2a and the second surface 2b. In this case, a reliable electrical connection via the through hole 7 in the semiconductor substrate 2 can be formed. Here, the aspect ratio of the through hole 7 is 0.2 to 10. As an example, the depth of the through hole 7 is 40 μm, and the width of the second opening 7b is 30 μm. In this case, the aspect ratio is 1.3. Here, the through hole 7 having a shape such as a cylindrical shape or a quadrangular prism shape is formed by, for example, dry etching.

In the through hole 7 shown in FIG. 9, the average inclination angle β of the second region 12 is smaller than the average inclination angle α of the first region 11, and is also smaller than the average inclination angle γ (in this case, 90°) of the inner surface 7c of the through hole 7. That is, the second region 12 is a region that has a gentler inclination than the first region 11 and has a gentler inclination than the inner surface 7c of the through hole 7. In addition, the average inclination angle α of the first region 11 is closer to the average inclination angle γ of the inner surface 7c of the through hole 7 than the average inclination angle β of the second region 12. Here, the relationship of the average inclination angle γ of the inner surface 7c of the through hole 7>the average inclination angle α of the first region 11>the average inclination angle β of the second region 12 is established. Accordingly, it is possible to prevent a disconnection of the second wiring 8 and it is possible to obtain the opening 10a having a sufficient area for exposing the pad portion 3a of the first wiring 3. In addition, the surface 10b of the insulating layer 10 is a continuous surface (a surface in which there is no discontinuous portion such as an intersection line (such as a corner or a bent portion) between a surface and a surface, and the regions 11, 12, 13, 14, and 15 are smoothly connected). In addition, in the insulating layer 10, when the surface S passing through the edge of the opening 10a of the insulating layer 10 and the edge of the second opening 7b of the through hole 7 is set as a boundary surface, and the portion P1 on the inner surface 7c side of the through hole 7 with respect to the surface S and the portion P2 on the side opposite the inner surface 7c of the through hole 7 with respect to the surface S are focused on, the volume of the portion P1 is larger than the volume of the portion P2. In addition, in the insulating layer 10, when attention is paid to a region on one side of the center line CL in the plane including the center line CL of the through hole 7, an area of the triangle T1 is larger than an area of the triangle T2. In addition, in a direction parallel to the first surface 2a and the second surface 2b of the semiconductor substrate 2, an average thickness of the portion corresponding to the first region 11 within the insulating layer 10 is greater than an average thickness of the portion corresponding to the second region 12 within the insulating layer 10.

In addition, the first region 11 may be the surface 10b of a portion having a height H of ⅔ of a sum D of the thickness of the semiconductor substrate 2 and the average thickness of the insulating layer 10 provided on the second surface 2b of the semiconductor substrate 2 or less within the insulating layer 10 provided on the inner surface 7c of the through hole 7 (refer to FIG. 9). In this case, on the surface 10b of the insulating layer 10, the first region 11 and the second region 12 are smoothly connected, and it is possible to reliably prevent a disconnection of the second wiring 8 at a boundary between the first region 11 and the second region 12. Here, during exposure and development, since the thickness of the portion corresponding to the contact hole 16 in the insulating layer 10 becomes thinner (that is, since the portion corresponding to the contact hole 16 is a portion having a height H of ⅔ of a sum D of the thickness of the semiconductor substrate 2 and the average thickness of the insulating layer 10 provided on the second surface 2b or less within the insulating layer 10) due to the recess 17 formed in the insulating layer 10, it is possible to obtain the contact hole 16 having a desired shape easily and reliably.

In addition, in the method of manufacturing the semiconductor device 1, the dip coating method is performed, and thus the insulating layer 10 is provided on the inner surface 7c of the through hole 7 and the second surface 2b of the semiconductor substrate 2. However, the present invention is not limited thereto. For example, the insulating layer 10 may be provided on the inner surface 7c of the through hole 7 and the second surface 2b of the semiconductor substrate 2 by performing another method such as a lamination method using a resin sheet and a spin coating method using a resin paint.

In addition, in the method of manufacturing the semiconductor device 1, the insulating layer 10 is provided on the inner surface 7c of the through hole 7 and the second surface 2b of the semiconductor substrate 2 using the positive resin material, and the portion corresponding to the contact hole 16 in the insulating layer 10 is exposed and developed, and thus the contact hole 16 is formed in the insulating layer 10. However, the present invention is not limited thereto. For example, using a negative-type resin material, the insulating layer 10 may be provided on the inner surface 7c of the through hole 7 and the second surface 2b of the semiconductor substrate 2. In this case, a portion other than the portion corresponding to the contact hole 16 in the insulating layer 10 is exposed, and the portion corresponding to the contact hole 16 in the insulating layer 10 is developed so that the contact hole 16 may be formed in the insulating layer 10. The tapered contact hole 16 that enlarges from the second surface 2b to the first surface 2a of the semiconductor substrate 2 may be formed simply by the development according to light attenuation, light diffraction, and the like. However, when a heat treatment or the like is additionally performed, it is possible to obtain the tapered contact hole 16 that enlarges from the first surface 2a to the second surface 2b of the semiconductor substrate 2.

In addition, in the above embodiment, the P-type region 2c in which P-type impurities are selectively diffused is provided in a predetermined region on the first surface 2a side in the semiconductor substrate 2 including, for example, N-type silicon. However, conductivity-types may be vice versa. In this case, the extraction electrode 9 and the extraction electrode 23 function as a cathode electrode and an anode electrode, respectively. Further, there is no limitation to a structure in which a second-conductivity-type (the other of the P-type and the N-type) region is formed in a first-conductivity-type (one of the P-type and the N-type) semiconductor substrate 2, and a structure in which a second-conductivity-type (the other of the P-type and the N-type) semiconductor layer is formed on a first-conductivity-type (one of the P-type and the N-type) semiconductor substrate 2 or a structure in which a first-conductivity-type (one of the P-type and the N-type) semiconductor layer is formed on a substrate of a second-conductivity-type (the other of the P-type and the N-type) semiconductor layer formed on the first-conductivity-type semiconductor layer may be used. That is, the second-conductivity-type region may be formed on the first-conductivity-type region of the semiconductor substrate 2. In addition, in the above embodiment, the semiconductor device 1 is an optical device, for example, a silicon photodiode. However, the semiconductor device 1 may be another optical device, or may be an electronic device, or the like.

INDUSTRIAL APPLICABILITY

According to the present invention, it is possible to provide a semiconductor device capable of forming a reliable an electrical connection via a through hole in a semiconductor substrate and a method of manufacturing such a semiconductor device.

REFERENCE SIGNS LIST

1: Semiconductor device, 2: Semiconductor substrate, 2a: First surface, 2b: Second surface, 3: First wiring, 7: Through hole, 7a: First opening, 7b: Second opening, 7c: Inner surface, 8: Second wiring, 10: Insulating layer, 10a: Opening, 10b: Surface, 11: First region, 12: Second region, 13: Third region, 14: Fourth region, 15: Fifth region, 16: Contact hole.

The invention claimed is:

1. A semiconductor device comprising:
a semiconductor substrate that has a first surface and a second surface opposite to each other and in which a through hole to extend from the first surface to the second surface is formed;
a first wiring that is provided on the first surface and has a portion located above a first opening of the through hole on the first surface side;
an insulating layer that is provided on an inner surface of the through hole and the second surface and is continuous through a second opening of the through hole on the second surface side; and
a second wiring that is provided on a surface of the insulating layer and is electrically connected to the first wiring in an opening of the insulating layer on the first surface side,
wherein the surface of the insulating layer includes a tapered first region that reaches the first opening inside the through hole and enlarges from the first surface to the second surface,
a tapered second region that reaches the second opening inside the through hole and enlarges from the first surface to the second surface,
a third region that faces the second surface outside the through hole,
a fourth region that is curved to continuously connect the first region and the second region, and
a fifth region that is curved to continuously connect the second region and the third region,
wherein an average inclination angle of the second region is smaller than an average inclination angle of the first region and is smaller than an average inclination angle of a portion of the inner surface of the through hole corresponding to the second region, and
wherein a thickness of the insulating layer in the second region in a direction parallel to the first surface and the second surface increases toward the first opening.

2. The semiconductor device according to claim 1, wherein the average inclination angle of the first region is closer to the average inclination angle of the inner surface of the through hole than the average inclination angle of the second region.

3. The semiconductor device according to claim 1, wherein an average thickness of the insulating layer provided on the inner surface of the through hole is greater than an average thickness of the insulating layer provided on the second surface.

4. The semiconductor device according to claim 1, wherein the first region is a surface of a portion of the insulating layer having a height of ⅔ or less of a sum of the thickness of the semiconductor substrate and the average thickness of the insulating layer provided on the second surface.

5. The semiconductor device according to claim 4, wherein the first region has a height of ½ or less of the sum of the thickness of the semiconductor substrate and the average thickness of the insulating layer provided on the second surface.

6. The semiconductor device according to claim 1, wherein the fourth region is a region having a maximum convex curvature toward the side opposite the inner surface of the through hole.

7. The semiconductor device according to claim 1, wherein the inner surface of the through hole is a tapered surface that enlarges from the first surface to the second surface.

8. The semiconductor device according to claim 1, wherein the inner surface of the through hole is a surface orthogonal to the first surface and the second surface.

9. The semiconductor device according to claim 1, wherein the insulating layer is made of a resin.

10. A method of manufacturing a semiconductor device according to claim 1, comprising
a first process in which a first wiring is provided on a first surface of a semiconductor substrate that has the first surface and a second surface opposite to each other;
a second process in which a through hole to extend from the first surface to the second surface is formed in the semiconductor substrate, and a portion of the first wiring is exposed to a first opening of the through hole on the first surface side;
a third process in which an insulating layer that is continuous through a second opening of the through hole on the second surface side is provided on an inner surface of the through hole and the second surface;

a fourth process in which a contact hole is formed in the insulating layer and the portion of the first wiring is exposed to an opening of the insulating layer on the first surface side;

a fifth process in which a second wiring is provided on a surface of the insulating layer and the first wiring and the second wiring are electrically connected in the opening of the insulating layer on the first surface side.

11. The method of manufacturing a semiconductor device according to claim 10, wherein, in the third process, a dip coating method is performed using a resin material having a viscosity of 10 cp or more, and thus the insulating layer is provided on the inner surface of the through hole and the second surface.

12. The method of manufacturing a semiconductor device according to claim 10, wherein, in the third process, the insulating layer is provided on the inner surface of the through hole and the second surface by using a positive resin material, and wherein, in the fourth process, a portion corresponding to the contact hole in the insulating layer is exposed and developed, and thus the contact hole is formed in the insulating layer.

* * * * *